(12) United States Patent
Jang et al.

(10) Patent No.: US 11,847,328 B1
(45) Date of Patent: Dec. 19, 2023

(54) METHOD AND SYSTEM FOR MEMORY POOL MANAGEMENT

(71) Applicant: Arista Networks, Inc., Santa Clara, CA (US)

(72) Inventors: Chen Jia Jang, Burnaby (CA); Suhas Raghunath Joshi, San Jose, CA (US); Ganesan Venkataraman, Sunnyvale, CA (US)

(73) Assignee: Arista Networks, Inc., Santa Clara, CA (US)

( * ) Notice: Subject to any disclaimer, the term of this patent is extended or adjusted under 35 U.S.C. 154(b) by 7 days.

(21) Appl. No.: 17/877,801

(22) Filed: Jul. 29, 2022

(51) Int. Cl.
*G06F 3/00* (2006.01)
*G06F 3/06* (2006.01)

(52) U.S. Cl.
CPC .......... *G06F 3/0629* (2013.01); *G06F 3/065* (2013.01); *G06F 3/0604* (2013.01); *G06F 3/0679* (2013.01)

(58) Field of Classification Search
None
See application file for complete search history.

(56) References Cited

U.S. PATENT DOCUMENTS

| 7,565,482 B1 | 7/2009 | Rangarajan et al. |
| 2013/0246698 A1 | 9/2013 | Estan et al. |
| 2014/0321467 A1 | 10/2014 | Wang et al. |

FOREIGN PATENT DOCUMENTS

KR 20190124204 * 11/2019

* cited by examiner

*Primary Examiner* — Midys Rojas
(74) *Attorney, Agent, or Firm* — Fountainhead Law Group, P.C.

(57) ABSTRACT

A logical table is configured with a first set of memory banks, where each logical row in the logical table comprises a corresponding memory row from each of the memory banks. Lookup instructions to access a logical row includes a bank set that lists the memory banks associated with that logical row. In response to a range of memory rows of one of the memory banks being reallocated to another logical table, a new memory bank is identified to store the data in the reallocated memory rows. Logical rows associated with the reallocated memory rows are mapped to the new memory bank. Bank sets in the lookup instructions that refer to the remapped logical rows are updated to list the new memory bank in place of the "old" memory bank.

19 Claims, 11 Drawing Sheets

METHOD AND SYSTEM FOR MEMORY POOL MANAGEMENT

BACKGROUND

Packet forwarding in a network device such as a switch or router typically involves matching a packet against a forwarding table to identify a forwarding rule. The identified forwarding rule can inform the next hop address and/or actions to be taken on the packet. Packet forwarding typically employs a pipelined architecture. In order to support large routing scales on the pipeline, the forwarding table can be divided into two stages: a first stage lookup table comprising a TCAM (ternary content addressable memory) and a second stage lookup table comprising several banks of SRAMs (static random access memories) allocated from an SRAM module. In some embodiments, the first stage TCAM can be used to do a fast lookup on a first portion of the search key (e.g., a destination IP address) for matching a packet, and the second stage SRAM banks can be used to do a subsequent lookup on a second portion of the search key. The second stage SRAM banks can be viewed as providing a logical table that is as wide as the number of second stage SRAM banks; for example, a logical row can comprise the same physical row from each SRAM bank.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings.

DETAILED DESCRIPTION

In the following description, for purposes of explanation, numerous examples and specific details are set forth in order to provide a thorough understanding of embodiments of the present disclosure. Particular embodiments as expressed in the claims may include some or all of the features in these examples, alone or in combination with other features described below, and may further include modifications and equivalents of the features and concepts described herein.

Figure 1:
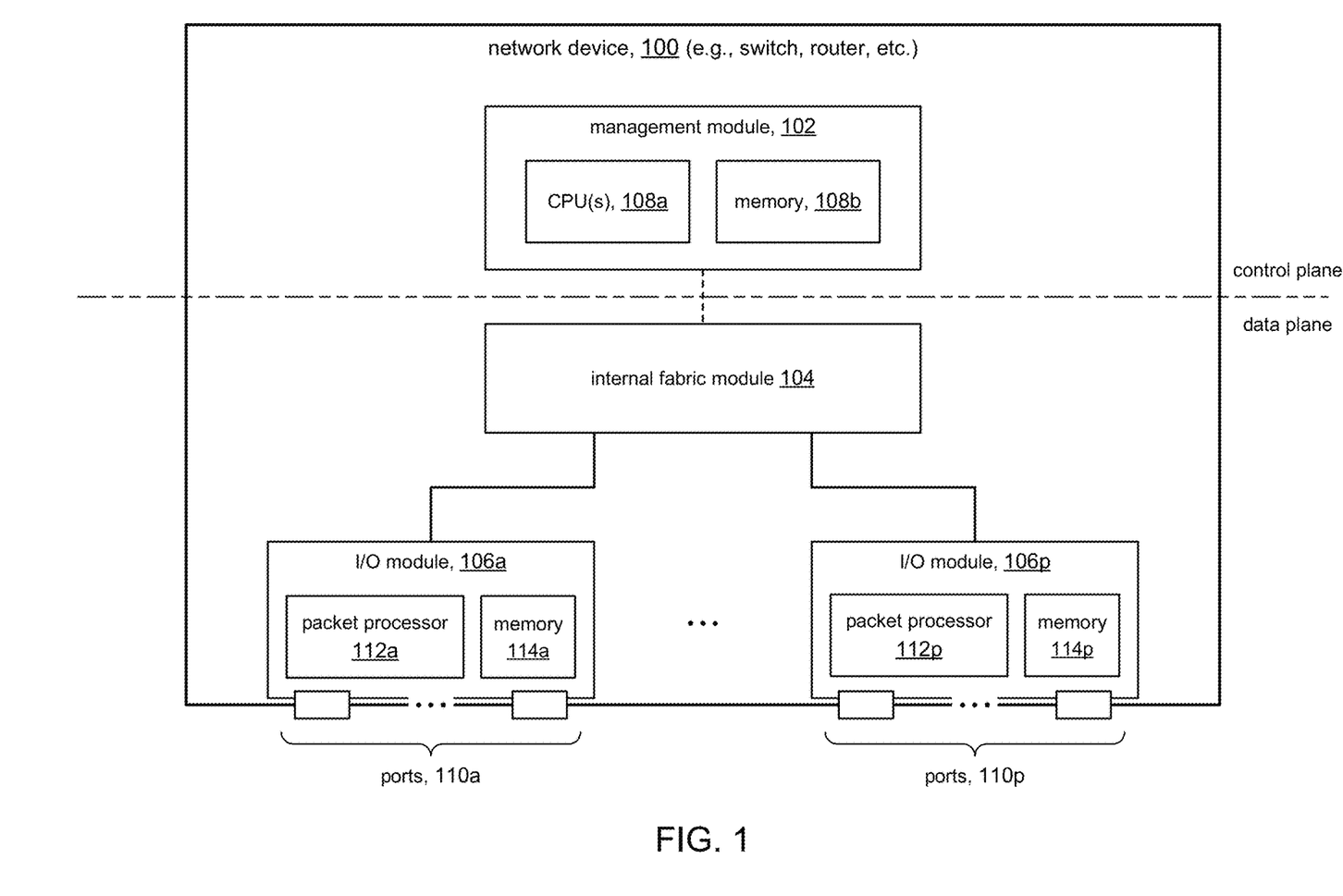
FIG. 1 is a high level block diagram of a network device in accordance with some embodiments of the present disclosure.

FIG. 1 shows details for an illustrative example of a network device (e.g., switch, router, gateway, etc.) in accordance with some embodiments of the present disclosure. As shown, network device 100 can include a management module 102, an internal fabric module 104, and one or more I/O modules 106a-106p. Management module 102 constitutes the control plane (also referred to as the control layer) of network device 100 and can include one or more management CPUs 108a for managing and controlling operation of network device 100 in accordance with the present disclosure. Management CPU 108a can be a general purpose processor, such as but not limited to an Intel®/AMD® x86 or ARM® processor, that operates under the control of software stored in a memory 108b, such as dynamic random access memory (DRAM). The control plane provides processes to determine which path to use, such as routing protocols, spanning tree learning, and the like.

Internal fabric module 104 and I/O modules 106a-106p collectively represent the data plane of network device 100 (also referred to as the data layer, forwarding plane, etc.). Internal fabric module 104 serves to interconnect the various other modules of network device 100. Each I/O module 106a-106p includes one or more input/output ports 110a-110p that are used by network device 100 to send and receive network packets. Each I/O module 106a-106p can also include packet processing capability, logically represented by respective packet processors 112a-112p and memory components 114a-114p. Packet processors 112a-112p can comprise forwarding hardware, including for example, data processing elements such as ASICs (application specific integrated circuits), FPGAs (field programmable arrays), digital processing units, and the like. Memory components 114a-114p can include lookup hardware including content addressable memory such as TCAMs and auxiliary memory such as SRAMs. The forwarding hardware in conjunction with the lookup hardware can provide wire speed decisions on how to process ingress packets and outgoing packets for egress.

In accordance with the present disclosure, memory components 114a-114p can hold information for processing packets in accordance with the present disclosure. The TCAM and SRAMs can be configured for operation in accordance with the present disclosure as described herein.

Figure 2:
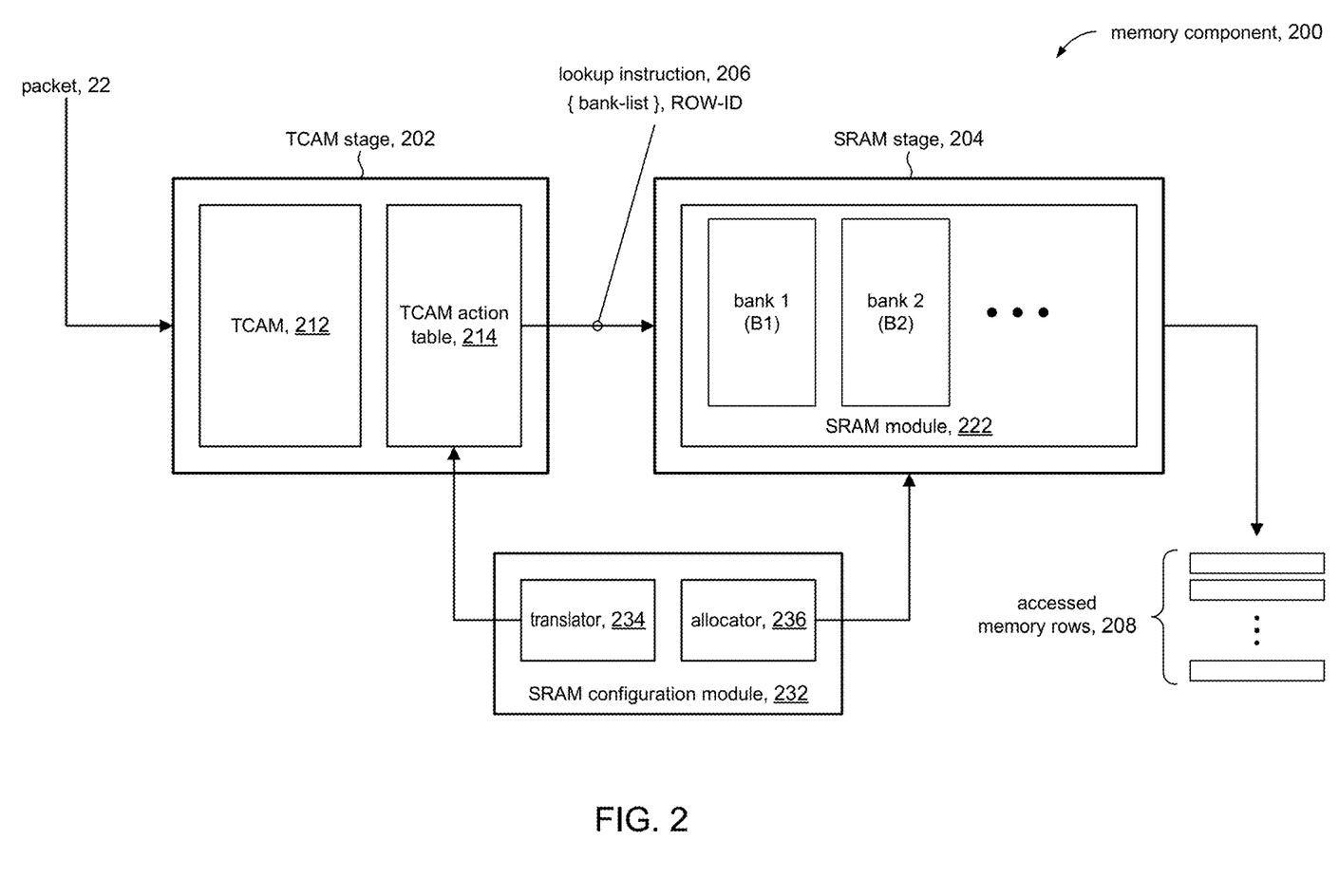
FIG. 2 represents a memory component in accordance with some embodiments of the present disclosure.

FIG. 2 shows details of a memory component 200 (e.g., 114a, FIG. 1) in accordance with some embodiments. In some embodiments, for instance, memory component 200 can comprise TCAM stage 202 and SRAM stage 204. TCAM stage 202 can comprise a TCAM 212 and a TCAM action table 214. SRAM stage 204 can comprise an SRAM memory module 222 that is organized into banks of SRAM memory; e.g., bank 1, bank 2, etc. The memories that constitute the TCAM stage and the SRAM stage can be any suitable physical persistent memory, such as content addressable memory, static random access memory, and the like.

Packet 22 (e.g., a network data packet) can be provided to TCAM stage 202 to output or otherwise produce lookup instruction 206. The lookup instruction can be provided to SRAM stage 204. In some embodiments, lookup instruction 206 can specify a bank set and a row identifier (ID). The bank set can specify one or more memory banks in the SRAM stage to access, and the row ID can identify a corresponding physical memory row from each of the specified memory banks to output.

SRAM configuration module 232 can configure memory component 200 in accordance with the present disclosure. SRAM configuration module 232 can be a component in the control plane or the data plane of the network device. In accordance with some embodiments, SRAM configuration module 232 comprises a translator module 234 and an allocator module 236. Additional details are described below.

Figure 3:
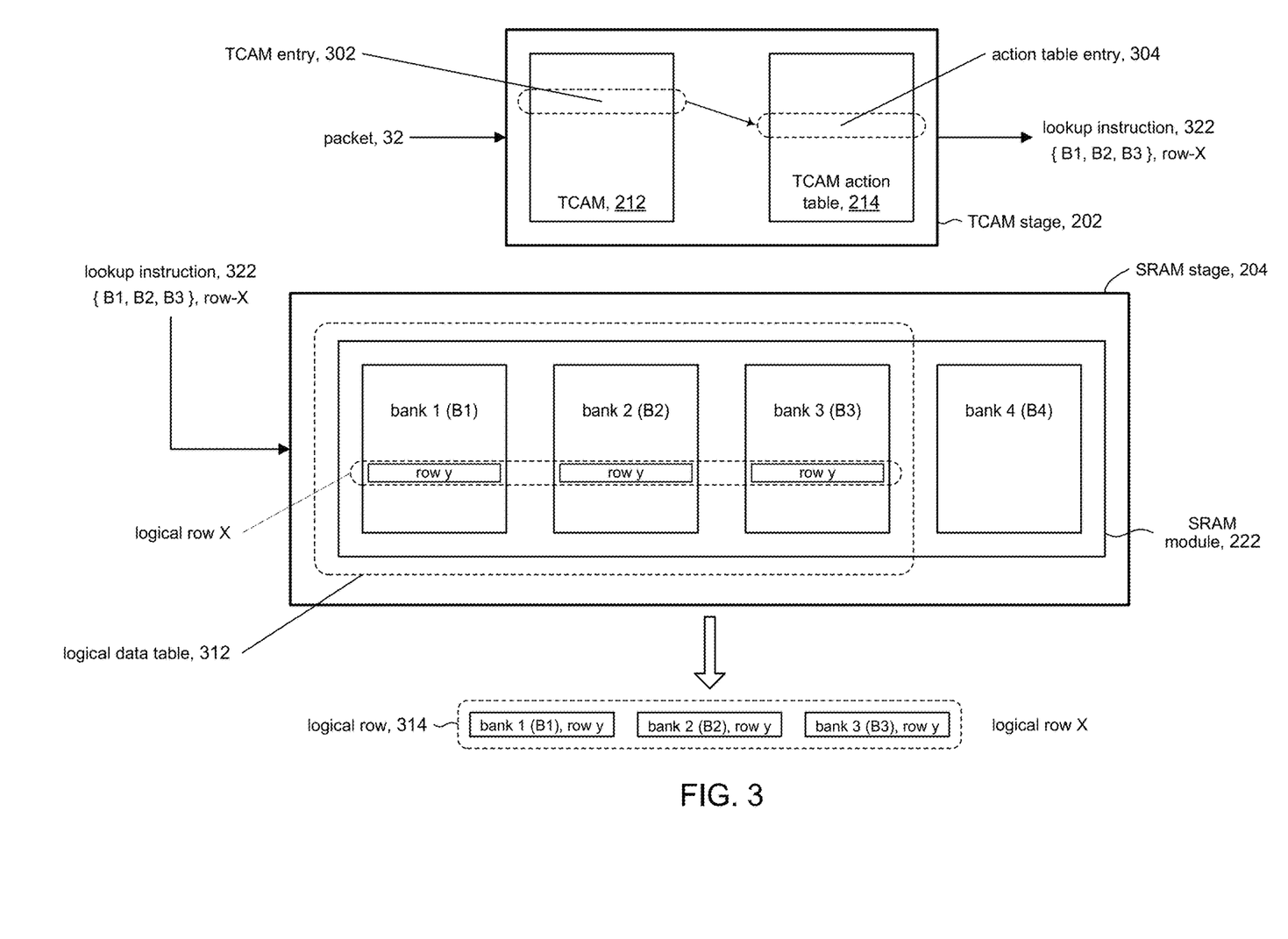
FIG. 3 shows some details of the memory component of FIG. 2.

FIG. 3 shows additional details for TCAM stage 202 and SRAM stage 204. In some embodiments, for example, TCAM 212 comprises TCAM entries. A TCAM entry 302 can include various data fields (not shown) including a match field and an action identifier. The match field can match on various data fields of packet 32, such as but not limited to, IP (Internet protocol) and MAC (media access control) addresses, a protocol-type data field, source and destination ports, parts of the packet payload, and so on. The action identifier can identify an action entry 304 in TCAM action table 214 that stores a corresponding lookup instruction 322.

In some embodiments, SRAM module 222 is based on a memory architecture referred to as a memory pool. Each memory bank in SRAM module 222 can be accessed in units of a "row" of physical memory comprising some number of N memory locations (e.g., N bytes, N words, etc.). SRAM module 222 can support a "logical row" that is defined across one or more memory banks. The lookup instruction can inform SRAM module 222 on how to access the memory rows that correspond to the logical row, to read out the accessed memory rows. When a logical row is accessed, the SRAM module can read out data from the corresponding rows of physical memory of the constituent memory banks.

A logical table 312 can be defined with logical rows that are mapped to various memory banks in SRAM module 222. Logical tables can be configured for any suitable use in network device 100. Merely to provide some context for discussion purposes, for instance, logical table 312 can be used as a longest prefix match (LPM) table in conjunction with TCAM stage 202 to support packet matching. Merely for purposes of explaining an example, suppose we search for a rule using the destination address in a packet as the search key. A fast lookup can be performed in TCAM stage 202 to match on the first 'n' bits of the destination address to produce lookup instruction 304. The lookup instruction 304 can specify a logical row x in the logical table 312 that stores the match criteria for the remaining (32-n) bits (assuming a 32-bit IPv4 address) of the destination address and corresponding actions (e.g., forward the packet, drop the packet, police the packet flow, and so on).

Suppose for discussion purposes only, and without loss of generality, that SRAM module 222 comprises four memory banks: bank B1, bank B2, bank B3, bank B4. Logical table 312 is shown to be defined across memory banks B1, B2, and B3. Suppose further that the logical rows of logical table 312 map to the same range of physical rows in each of memory banks B1, B2, B3. Each logical row 314 in logical table 312 comprises a corresponding physical memory row from each memory bank that constitutes the logical table, which in this example are banks B1, B2, B3. Stated differently, memory row y in bank B1 represents a portion of logical row x, memory row y in bank B2 represents a portion of logical row x, and memory row y in bank B3 represents a portion of logical row x.

It will be appreciated by persons of ordinary skill in the art that the flexibility in mapping logical rows to physical rows will depend on a given implementation of the SRAM module 222. Logical rows can be mapped to one memory bank or across multiple memory banks. A range of logical rows can be mapped to different ranges of physical rows in different memory banks. For example, a range of logical rows (e.g., logical rows 10-25) can be mapped to one range of physical rows in one memory bank (e.g., physical rows 100-125) and to another, different range of physical rows in another memory bank (e.g., physical rows 200-225). For example, accessing logical row 12 would yield the content of physical row 102 from the one memory bank and physical row 202 from the other memory bank.

Continuing with FIG. 3, the illustrative configuration of logical table 312 in FIG. 3 shows that the logical table comprises banks B1, B2, B3. In some embodiments, logical table 312 can be accessed by providing lookup instruction 322 to SRAM module 222. The lookup instruction comprises a bank set parameter and a row ID parameter. The bank set parameter specifies the set of memory banks that constitute the logical table, and the row ID parameter specifies the logical row to read from. The example in FIG. 3 shows lookup instruction 322 for accessing logical row x from banks B1, B2, B3. Mapping configuration information in SRAM module 222 can map the row ID specified in the lookup instruction to a corresponding physical memory row in each memory bank specified in the bank set. The example in FIG. 3, for instance, shows that logical row x maps to physical row y from each of banks B1, B2, and B3.

Figure 4A:
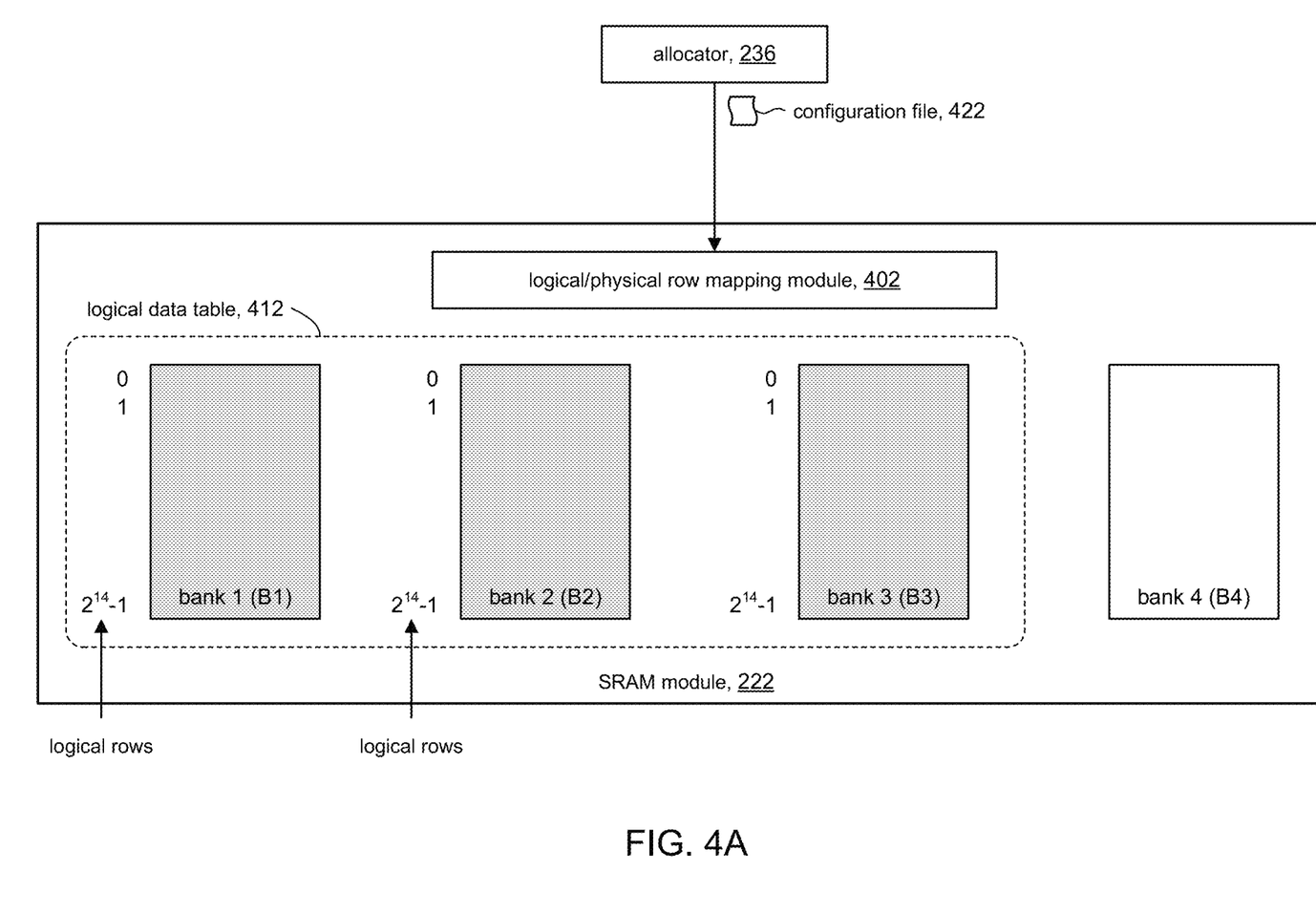
FIGS. 4A, 4B, 4C illustrate examples of logical table mapping configurations.

FIG. 4A shows additional detail in the memory banks of SRAM module 222 in accordance with an illustrative embodiment. The example is provided merely for purposes of explaining aspects of the present disclosure. Suppose the network device includes a logical table 412 that comprises 16K logical rows ($K=2^{10}$). Suppose further, for discussion purposes, that each memory bank comprises 16K rows of memory. The figure shows logical table 412 in a first configuration, in which the logical table is mapped onto three memory banks B1, B2, B3. Furthermore, the logical rows are mapped one-to-one with physical memory rows (locations) in each of the constituent memory banks. For example, logical row 0 in logical table 412 maps to corresponding physical memory row 0 in B1, physical memory row 0 in B2, and physical memory row 0 in B3. In general, logical row i maps to corresponding physical memory row i in each bank B1, B2, and B3. Stated differently, the range of logical rows $0-2^{14}-1$ is mapped to a corresponding range of physical memory rows $0-2^{14}-1$ in each memory bank.

The lookup instructions for accessing logical table 412 can be expressed as:

$$\{B1, B2, B3\}, x, \text{ for } x=0-2^{14}-1$$

where x is the logical row of interest.

SRAM module 222 can include row mapping module 402 (e.g., registers, memory for lookup tables, logic circuits, etc.) to store mapping information that maps logical rows of a logical table to physical memory rows in memory banks B1-B4, and uses the mapping information to access a logical row. The mapping information can include information that identifies the logical table to which a given logic row or range of logical rows belongs.

In accordance with some embodiments, allocator 236 can define logical tables with suitable configurations of memory banks. In some embodiments, for example, allocator 236 can create a configuration file 422 (e.g. a XML file, extended markup language) that specifies which rows of memory from which memory banks map to which logical rows in which logical tables. The configuration of logical table 412 shown in FIG. 4A is an example of such a configuration.

In some embodiments, the physical memory in SRAM module 222 may impose certain constraints on the way memory banks are allocated to the logical tables used by the network device. For example, it may be that memory can only be allocated in fixed-sized blocks. Hardware wiring limitations in the SRAM module may restrict allocating a full memory bank to a particular logical table. Certain logical tables may have a requirement that they comprise (are backed) by multiple memory banks, and so on. As a result, the configuration of a logical table (e.g., logical table 412) may have to be altered to accommodate another logical table. Using the configuration of logical table 412 in FIG. 4A, for example, there may be a use case where a chunk of memory from a memory bank (e.g., the bottom 8K from bank B3) must be allocated for another logical table in the network device. This would leave bank B3 with only the top 8K rows for logical table 412, where logical rows $0\text{-}2^{13}\text{-}1$ are retained for logical table 412. Bank B3 can no longer accommodate logical rows $2^{13}\text{-}2^{14}\text{-}1$ for logical table 412.

Figure 4B:
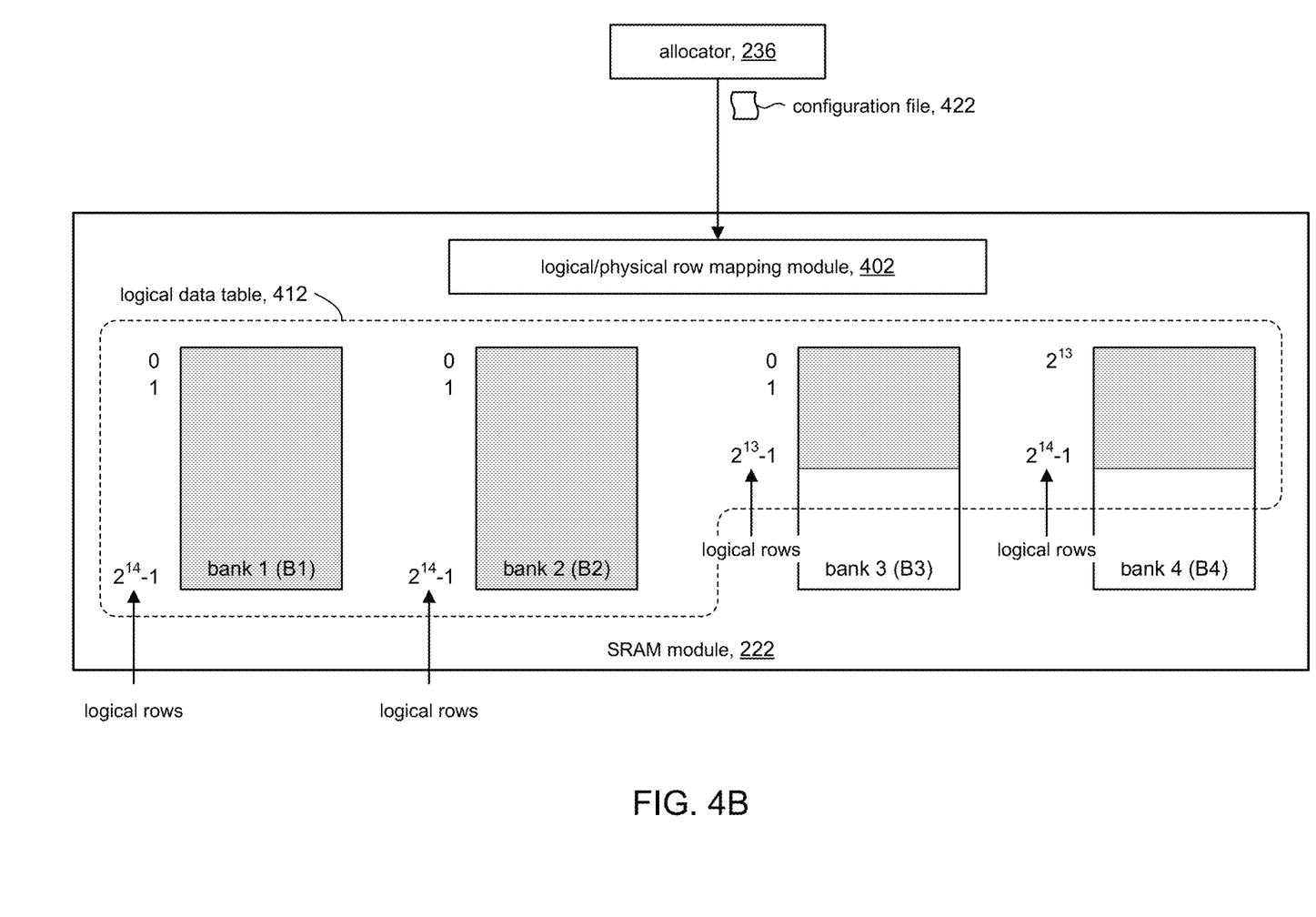
Figure 4C:
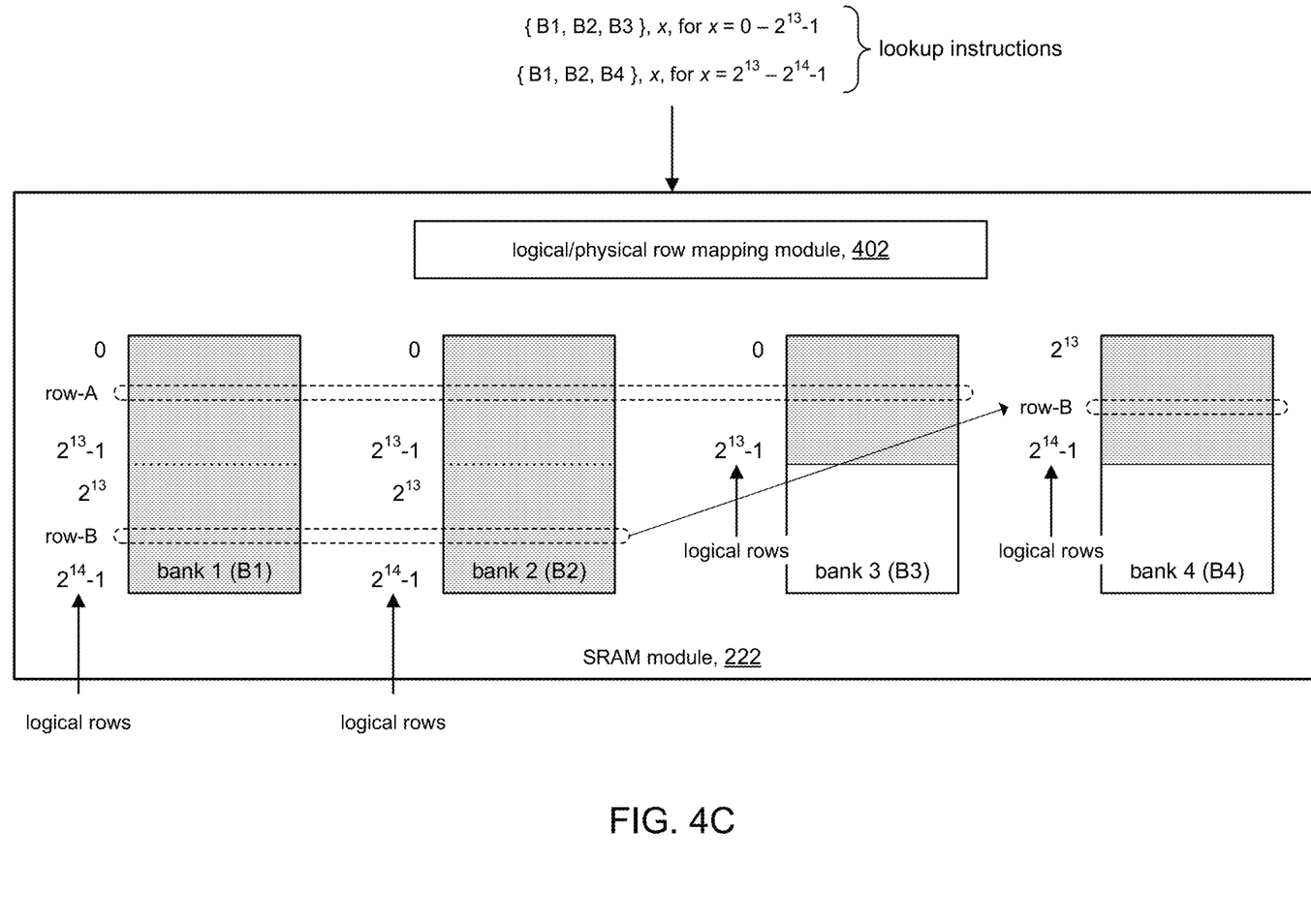

Referring to FIG. 4B, in accordance with the present disclosure, allocator 236 can remap different portions of the logical rows in a logical table to different sets of memory banks. Continuing with the example of logical table 412, FIG. 4B shows the logical table in a second (remapped) configuration. Here, logical rows $0\text{-}2^{13}\text{-}1$ (8K rows) remain mapped to physical memory rows in memory banks B1, B2, B3. Due to reallocation of B3, allocator 236 can remap logical rows $2^{13}\text{-}2^{14}\text{-}1$ in B3 to another available memory bank, for example, bank B4. FIGS. 4B and 4C show that logical rows $2^{13}\text{-}2^{14}\text{-}1$ of logical table 412 are mapped to corresponding physical memory rows in memory banks B1, B2, B4. For example, logical row-A maps to the same physical rows in banks B1, B2, B3, whereas logical row-B maps to the same physical rows in banks B1, B2 and to a different physical row in bank B4. Portions of logical row-B map to banks B1, B2 and a portion of logical row-B maps to bank B4.

Figure 5:
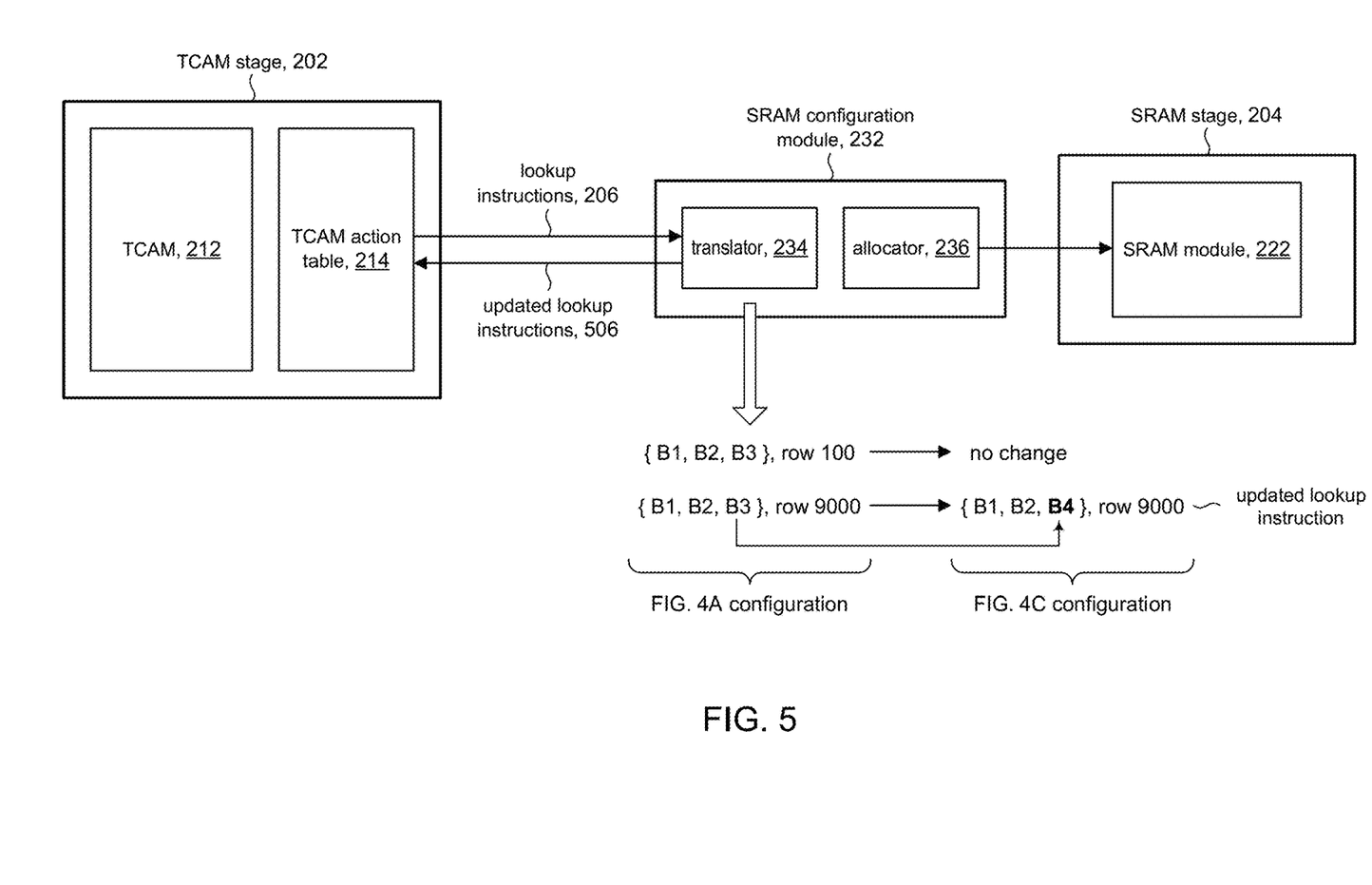
FIG. 5 illustrates an example of the interaction between the SRAM configuration module and the TCAM/SRAM stages.

Referring to FIGS. 4C and 5, the lookup instructions for accessing logical table 412 can have the form:

{B1, B2, B3}, x, for $x=0\text{-}2^{13}\text{-}1$

{B1, B2, B3}, x, for $x=2^{13}\text{-}2^{14}\text{-}1$

In accordance with another aspect of the present disclosure, when allocator 236 in SRAM configuration module 232 reconfigures the mapping between a logical table and the memory banks in SRAM module 222, the SRAM configuration module can trigger translator 234 to reprogram or otherwise update one or more of the lookup instructions that access the logical rows. Consider for example the lookup instructions 206 stored in TCAM action table 214. Using the examples in FIG. 4A and 4B, when logical table 412 is remapped from the configuration shown in FIG. 4A to the configuration shown in FIG. 4B, translator 234 can reprogram (or otherwise update) one or more lookup instructions 206 stored in the TCAM action table with corresponding updated lookup instructions 506.

The illustrative example in FIG. 5 shows the lookup instruction:

{B1, B2, B3}, row 100 does not need to be updated because the mapping of logical row 100 did not change between the FIG. 4A configuration and the FIG. 4B configuration. On the other hand, the lookup instruction:

{B1, B2, B3}, row 9000 from the FIG. 4A configuration needs to be updated because the mapping of logical row 9000 has changed in the configuration shown in FIG. 4B. Although logical row 9000 maps to the same physical memory row in memory banks B1 and B2 in the FIG. 4B configuration, logical row 9000 no longer maps to a physical memory row in memory bank B3. Instead, logical row 9000 maps to a physical memory row in memory bank B4. Accordingly, translator 234 would update the lookup instruction to:

{B1, B2, B4}, row 9000 and replace the entry in TCAM action table 214.

Referring to FIGS. 6 and 7A-7C, the discussion will now turn to a high-level description of processing in a network device (e.g., 100, FIG. 1), and in to particular processing in allocator 236, for updating the mapping of a logical table (e.g., 412) to physical memory (e.g., SRAM module 222) in accordance with the present disclosure. In some embodiments, for example, the network device can include one or more digital processing units, which when operated, can cause the network device to perform processing in accordance with FIG. 6. Digital processing units can include general CPUs in the control plane of the network device that operate by way of executing computer program code stored on a non-volatile computer readable storage medium (e.g., read-only memory); for example, CPU 108a in the control plane can be a general CPU. Digital processing units can include specialized processors in the data plane of the network device such as digital signal processors, field programmable gate arrays, application specific integrated circuits, and the like that operate by way of executing computer program code or by way of logic circuits being configured for specific operations. The operation and processing blocks described below are not necessarily executed in the order shown. Operations can be combined or broken out into smaller operations in various embodiments. Operations can be allocated for execution among one or more concurrently executing processes and/or threads.

Figure 6:
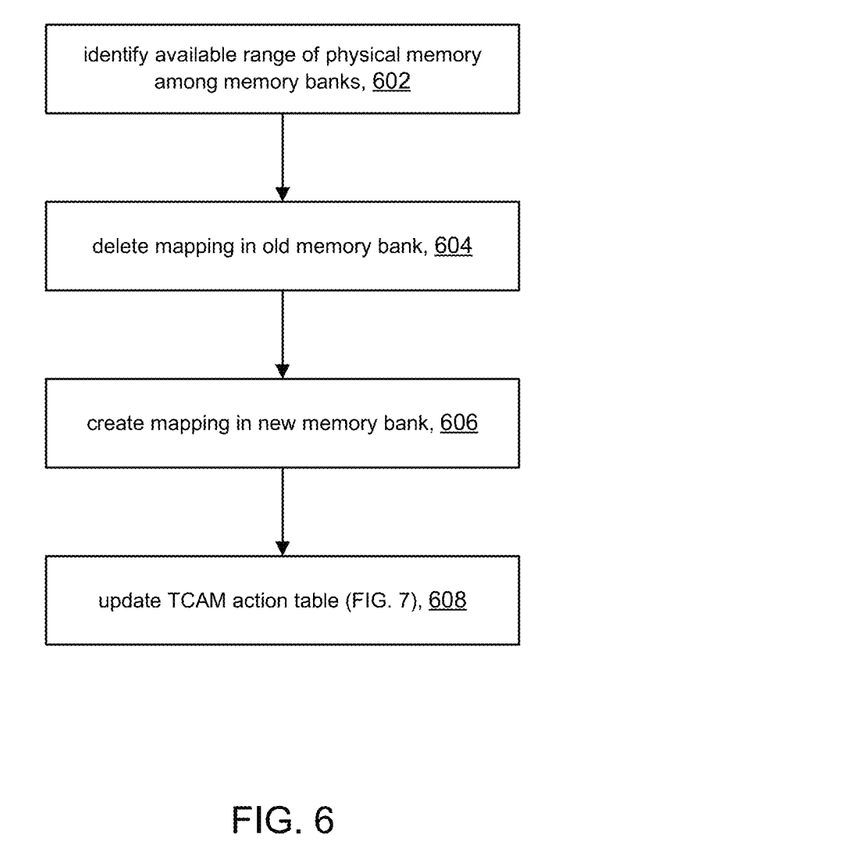
FIG. 6 is a representation of operations for configuring a logical table in accordance with the present disclosure.

At operation 602, the allocator can identify a new memory bank (or memory banks) to accommodate a range of logical rows (referred to herein as "targeted" logical rows) in a logical table that needs to be remapped. As explained above, certain constraints in the network device may require remapping of memory banks that constitute various logical tables used by the network device. The remapping may affect memory banks that were previously allocated to a logical table, requiring remapping of portions of the logical table. Allocator 236 can be triggered when portions of a logical table in the "old" memory need to be remapped to a "new" memory bank.

In some embodiments, the allocator can determine which logical rows in the old memory bank to remap. For example, suppose a range of 4K logical rows needs to be remapped from the old memory bank. The allocator can determine to remap the top 4K rows in the logical table or the bottom 4K rows, or somewhere in between. The remapping may be done in one or more groups of logical rows. Again, suppose a range of 4K logical rows needs to be remapped from the old memory bank. Depending on available space, the entire 4K may be remapped to another memory bank, or 2K is mapped to one bank and 2K is mapped to another band, and so on. The algorithms for determining the specific remapping of which logical rows to which memory banks can be influenced by factors such as availability of memory among the memory banks, constraints on how memory banks are allocated, and so on.

For discussion purposes, the remapping of logical table 412 (16K logical rows) from the mapping configuration shown in FIG. 4A to the configuration shown in FIG. 4B will serve as an illustrative example. FIG. 4A can represent an initial mapping (e.g., by the allocator or by some other memory configuration logic) that maps logical table 412 to memory banks in the SRAM module, where each memory bank B1, B2, B3 can initially hold the full range of 16K logical rows. Suppose that memory bank B3 is subsequently reconfigured in order to accommodate another logical table in the network device, for example, some memory rows in B3 become reallocated to the other logical table. Suppose further that as a result of memory B3 being reconfigured, B3 can now only accommodate 8K of the logical rows of logical table 412. Accordingly, 8K of logical rows in logical table 412 need to be remapped.

Continuing with the illustrative example, suppose the allocator has identified memory bank B4 as having 8K of available physical memory rows, and in particular that the first 8K of physical memory rows are available. Suppose further that the allocator has determined to remap the bottom 8K ($2^{13}$-$2^{14}$–1) of logical rows (the targeted logical rows) from memory B3 to memory B4.

Figure 7A:
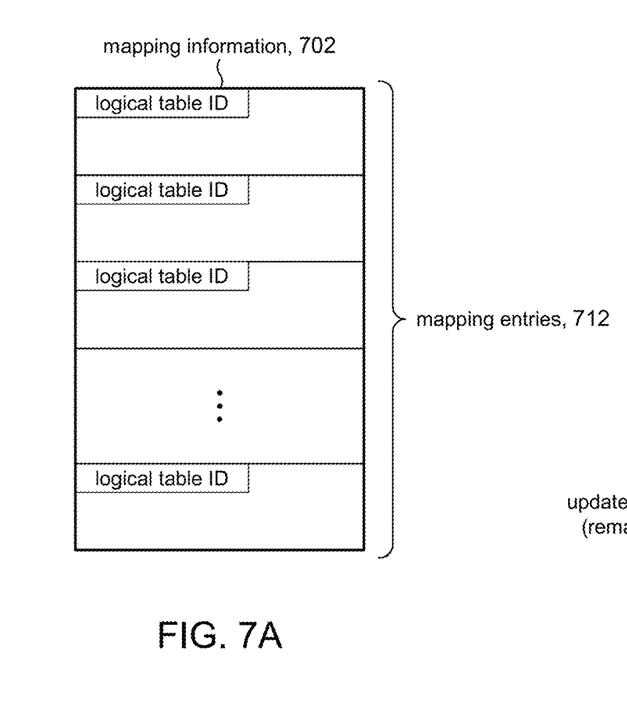
FIGS. 7A, 7B, 7C are representative examples of mapping information.

At operation 604, the allocator can update the mapping in the old (original) memory bank from which the targeted logical rows are to be remapped. As noted above, the mapping information informs the SRAM module the mapping between the logical rows of a logical table and the corresponding physical memory rows among the memory banks that constitute (back) the logical table. It will be appreciated that the mapping information can be implemented in any suitable manner; e.g., in table form, in register banks, and so on. Merely for discussion purposes, FIG. 7A is an illustrative representation of mapping information 702 that can be stored in or otherwise maintained by row mapping module 402. In some embodiments, mapping information 702 can comprise mapping entries 712 for the logical tables defined in the SRAM module. Each mapping entry 712 can include an identifier that identifies the logical table and row mapping information (e.g., FIG. 7B) for that logical table.

Figure 7B:
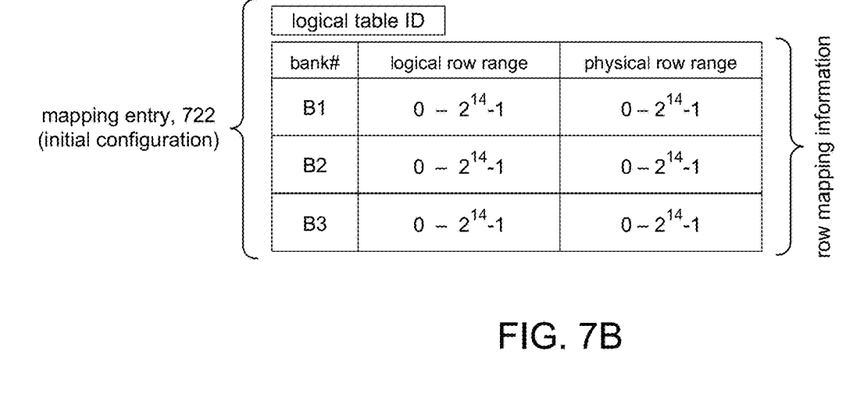
Figure 7C:
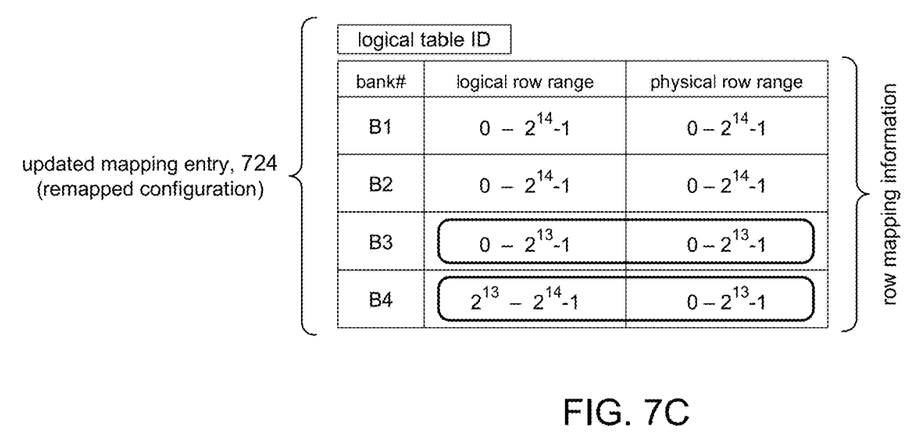

Referring to FIG. 7B and continuing with the illustrative example, mapping entry 722 represents the mapping information for logical table 412 for the initial mapping configuration shown in FIG. 4A. The mapping information in entry 722 shows that the range of logical rows 0–$2^{14}$–1 map one-to-one to physical rows 0–$2^{14}$–1 in memory bank B1. Logical rows 0–$2^{14}$–1 map one-to-one to physical rows 0–$2^{14}$–1 in memory bank B2 and likewise for memory bank B3. FIG. 7C shows the mapping for B3 in updated mapping entry 724, reflecting the configuration shown in FIG. 4B. Logical rows $2^{13}$-$2^{14}$–1 are no longer mapped to physical memory rows in (old) memory bank B3; only logical rows 0$2^{13}$–1 map one-to-one to physical rows 0–$2^{13}$–1 in memory bank B3.

At operation 606, the allocator can create a mapping in the new memory bank to which the targeted logical rows are to be remapped. Continuing with the illustrative example, the allocator will map the range of logical rows $2^{13}$-$2^{14}$–1 to physical memory rows 0–$2^{13}$–1 in (new) memory bank B4. Mapping entry 724 in FIG. 7C shows the mapping for memory bank B4. Content in the physical memory rows $2^{13}$-$2^{14}$–1 of old memory bank B3 can be copied to physical memory rows 0–$2^{13}$–1 in new memory bank B4.

At operation 608, the allocator can update lookup instructions in the TCAM action table 214 to reflect the new mapping(s). In some embodiments, the allocator can invoke the translator 234 to do the updates, which is described in FIG. 8 below. Processing by the allocator can be deemed complete.

Figure 8:
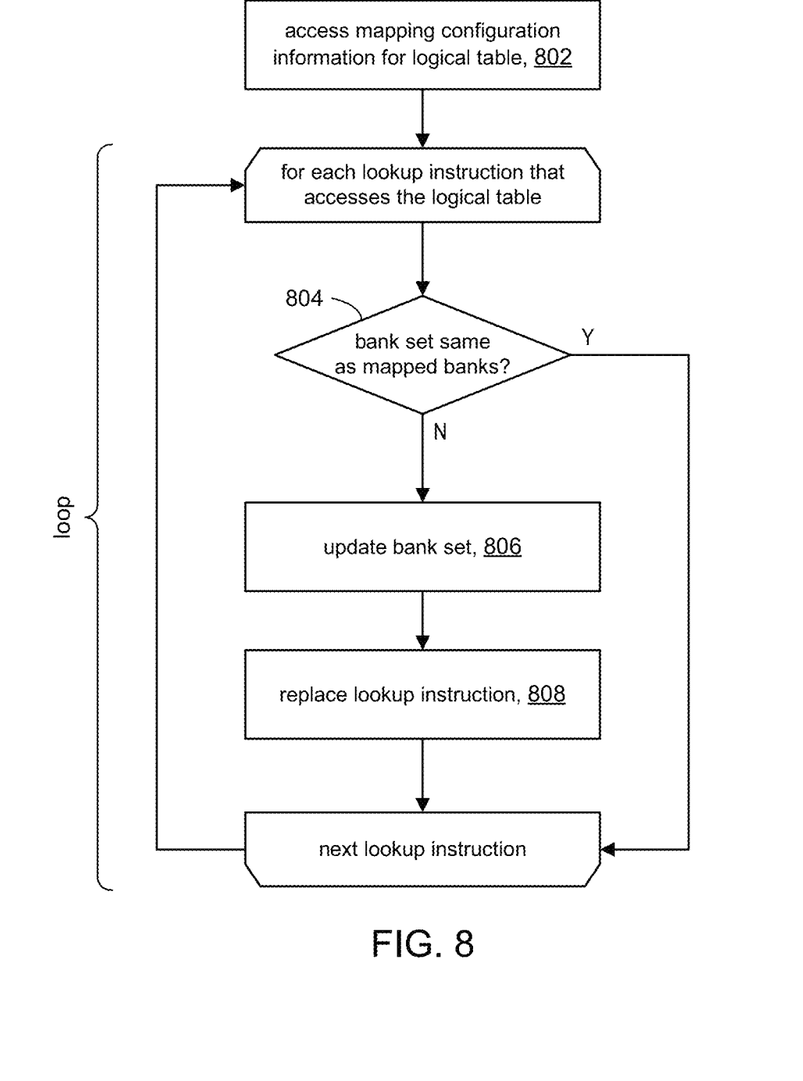
FIG. 8 is a representation of operations for translating lookup instructions in accordance with the present disclosure.
Figure 9A:
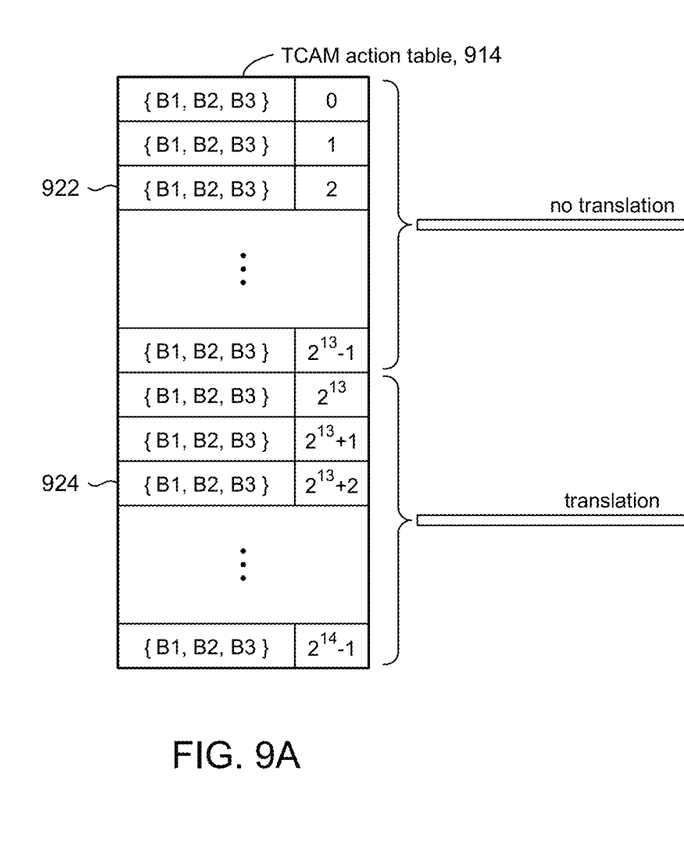
FIGS. 9A and 9B are representative examples of a TCAM action table.
Figure 9B:
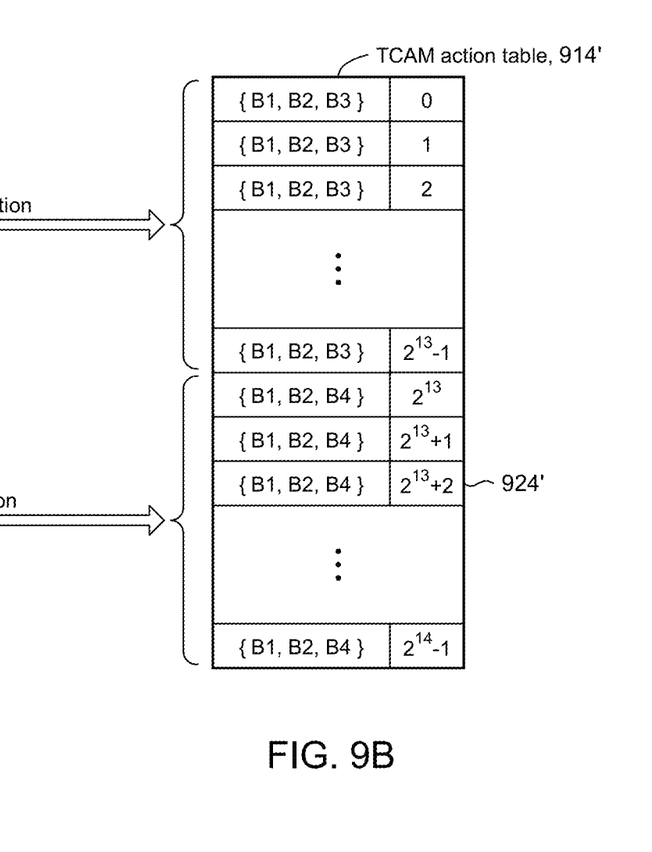

Referring to FIGS. 8 and 9, the discussion will now turn to a high-level description of processing in a network device (e.g., 100, FIG. 1), and in particular to processing in translator 234, for updating the mapping of a logical table (e.g., 412) to physical memory (e.g., SRAM module 222) in accordance with the present disclosure. In some embodiments, for example, the network device can include one or more digital processing units, which when operated, can cause the network device to perform processing in accordance with FIG. 8. Digital processing units can include general CPUs in the control plane of the network device that operate by way of executing computer program code stored on a non-volatile computer readable storage medium (e.g., read-only memory); for example, CPU 108*a* in the control plane can be a general CPU. Digital processing units can include specialized processors in the data plane of the network device such as digital signal processors, field programmable gate arrays, application specific integrated circuits, and the like that operate by way of executing computer program code or by way of logic circuits being configured for specific operations. The operation and processing blocks described below are not necessarily executed in the order shown. Operations can be combined or broken out into smaller operations in various embodiments. Operations can be allocated for execution among one ore more concurrently executing processes and/or threads.

As explained above, logical tables can be accessed by corresponding lookup instructions to access the physical memory that backs the logical tables. Accordingly, translator 234 can be invoked after a logical table has been remapped to translate or otherwise update the lookup instructions used to access the remapped logical table. To provide context, the discussion will continue with the illustrative example of logical table 412, whose underlying physical memory has been remapped as shown in FIGS. 4B and 7C. In some embodiments, logical table 412 can be accessed via lookup instructions 322 stored in TCAM action table 214. FIG. 9A shows (initial) lookup instructions in TCAM action table 914 to access logical table 412 for the memory bank configuration shown in FIG. 4A. Each lookup instruction in TCAM action table 914 specifies the same bank set, namely B1, B2, B3, for any given logical address 0-$2^{14}$–1. After remapping the logical table to the configuration of FIG. 4B, the lookup instructions can be translated or otherwise updated to reflect the remapping.

At operation 802, the translator can access the current mapping information contained in row mapping module 402 for the logical table of interest. Continuing with the illustrative example, FIG. 7C shows the current mapping information for logical table 412 subsequent to remapping the logical table. For each lookup instruction that accesses a logical row in the logical table, the translator can read out the lookup instruction for that logical row and update the lookup instruction based on the current mapping information. Continuing with the illustrative example, in the case of logical table 412, the lookup instructions can be read out from TCAM action table 214. Accordingly, the following operations can be performed for each lookup instruction that the translator reads out from the TCAM action table:

At decision point 804, the translator can determine whether to update the lookup instruction. In some embodiments, for example, if the list of memory banks in the mapping information matches the bank set in the lookup instruction for the logical row specified in the lookup instruction, then the lookup instruction does not need to be updated and processing can continue with the next lookup instruction. If the list of memory banks in the mapping information does not match the bank set in the lookup instruction, then processing can continue to operation 806. For example, it can be seen that between lookup instruction 922 in FIG. 9A and the mapping information in FIG. 7C, the lookup instruction does not need to be updated. On the other hand, for lookup instruction 924, the bank set shows B1, B2, B3, whereas the mapping information in FIG. 7C for logical row $2^{13}+2$ shows that the corresponding memory banks are B1, B2, B4. For lookup instruction 924, processing can continue to operation 806.

At operation 806, the translator can update a lookup instruction when the list of memory banks in the mapping information does not match the bank set for the logical row specified in the lookup instruction. FIGS. 9A and 9B show that the bank set in lookup instruction 924 (FIG. 9A) has been updated to lookup instruction 924' (FIG. 9B) to reflect that logical row $2^{13}+2$ now maps to memory banks B2, B2, B4.

At operation 808, the translator can write an updated lookup instruction to replace the original lookup instruction. Processing can continue with the next lookup instruction in TCAM action table 902. FIG. 9B represents the updated TCAM action table 914' after completion of the loop.

In accordance with some embodiments of the present disclosure, the initial configuration of memory banks that back a logical table can include splitting some of the logical rows across multiple memory banks. Consider the configuration of logical table 412, for example. When logical table 412 is first configured, the memory banks that map to the logical table may include allocating/mapping memory banks to the logical table as shown in FIG. 4B, rather than as shown in FIG. 4A, where memory banks B1, B2 can be mapped to respective portions of all 16K logical rows of the logical table, but remaining portions of the 16K logical rows are split between banks B3 (top 8K logical rows) and B4 (bottom 8K logical rows). This initial "split" configuration for logical table 412 can arise, for example, if parts of banks B3 and B4 had already been allocated to other logical tables prior to logical table 412 being allocated. Hardware limitations in SRAM module 222 (e.g., wiring limitations) may not allow banks B3 or B4 to allocate the full 16K logical rows to the logical table, and so on. The initial lookup instructions can reflect this split configuration, see for example FIG. 9B.

It will be appreciated that the bank splitting can occur at higher granularity, depending on the allocation capabilities of the SRAM module. Using the example shown in FIG. 4B, suppose banks B1, B2 store respective portions of all 16K logical rows of logical table 412. The remaining portions of the 16K logical rows can be split across more than just bank B3 and B4 as shown in FIG. 4B. For example, a portion of 4K of the logical rows may map to memory bank B3, a portion of another 4K of the logical rows may map to memory bank B4, a portion of another 2K of the logical rows may map to a memory bank B5 (not shown), a portion of another 2K of the logical rows may map to a memory bank B6 (not shown), and so on.

Embodiments in accordance with the present disclosure enable defining a large logical table of desired scale and size (to support a large route scale, for example). Embodiments in accordance with the present disclosure can achieve optimal utilization of the physical banks without wastage of memory that might otherwise not be allocated.

Further Examples

Features described above as well as those claimed below may be combined in various ways without departing from the scope hereof. The following examples illustrate some possible, non-limiting combinations:

(A1) A method comprising: configuring a logical table by configuring a physical memory comprising a plurality of memory banks, wherein the logical table comprises logical rows that are backed by a first plurality of the memory banks, wherein each logical row maps to a corresponding memory row in each of the first plurality of memory banks; storing in a data store lookup instructions for accessing the logical table, each lookup instruction associated with a logical row and a bank set, wherein the bank set in each lookup instruction references memory banks in the first plurality of memory banks; reconfiguring the logical table by remapping a subset of logical rows of the logical table that are mapped to memory rows in a memory bank ("old memory bank") among the first plurality of memory banks to memory rows in a new memory bank that is not among the first plurality of memory banks; and updating one or more of the lookup instructions for accessing the reconfigured logical table. The updating includes: identifying lookup instructions that specify logical rows among the remapped subset of logical rows; and updating the bank set in each of the identified lookup instructions to refer to memory banks in a second plurality of memory banks, wherein the second plurality of memory banks includes the new memory bank and does not include the old memory bank, The bank sets in lookup instructions associated with a logical row that is not among the remapped subset of logical rows refer to memory banks in the first plurality of memory banks. The bank sets in lookup instructions associated with a logical row that is among the remapped subset of logical rows refer to memory banks in the second plurality of memory banks.

(A2) For the method denoted as (A1), the method further comprises copying content from the memory rows in the old memory bank to the memory rows in the new memory bank.

(A3) For the method denoted as any of (A1) through (A2), wherein the memory rows in the old memory bank are different rows of memory than the memory rows in the new memory bank.

(A4) For the method denoted as any of (A1) through (A3), wherein the second plurality of memory banks further includes a subset the first plurality of memory banks that excludes the old memory bank.

(A5) For the method denoted as any of (A1) through (A4), wherein reconfiguring the logical table occurs in response to memory rows in the old memory bank that map to the subset of logical rows being allocated to another logical table.

(A6) For the method denoted as any of (A1) through (A5), wherein subsequent to reconfiguring the logical table, logical rows in the subset of logical rows are no longer mapped to the old memory bank and are mapped to the new memory bank.

(A7) For the method denoted as any of (A1) through (A6), wherein prior to remapping the logical table, a given logical row within the subset of logical rows comprises a corresponding memory row in the old memory bank, wherein subsequent to remapping the logical table, the given logical row comprises a corresponding memory row in the new memory bank.

(A8) For the method denoted as any of (A1) through (A7), the method further comprises: using a network packet to obtain a first entry in a lookup table; using the first entry to obtain one of the lookup instructions among the updated lookup instructions; accessing memory rows in memory banks listed in the bank set of the obtained lookup instruction that are mapped to the logical row of the obtained lookup instruction; and processing the network packet according to content in the accessed memory rows.

(B1) A network device comprising: a physical memory comprising a plurality of memory banks; one or more computer processors; and a computer-readable storage medium. The computer-readable storage medium comprises instructions for controlling the one or more computer processors to: configure a first mapping between a logical table and a plurality of memory banks, wherein logical rows of the logical table map to corresponding memory rows in each of the plurality of memory banks; store lookup instructions in a data table in the physical memory, wherein each lookup instruction is associated with a logical row and a bank set that specifies memory banks in the plurality of memory banks; configure a second mapping between the logical table and the plurality of memory banks and at least one new memory bank in response to memory rows in one of the memory banks in the plurality of memory banks becoming reallocated, wherein logical rows corresponding to the reallocated memory rows are remapped to memory rows in the new memory bank; and update lookup instructions in the data table whose logical rows are among the subset of logical rows by modifying bank sets in the lookup instructions to refer to the new memory bank in place of the memory bank with the reallocated memory rows.

(B2) For the network device denoted as (B1), wherein lookup instructions whose logical rows are not among the subset of logical rows are not updated.

(B3) For the network device denoted as any of (B1) through (B2), wherein the computer-readable storage medium further comprises instructions for controlling the one or more computer processors to copy content from the reallocated memory rows to memory rows in the new memory bank.

(B4) For the network device denoted as any of (B1) through (B3), wherein the reallocated memory rows are different rows than the memory rows in the new memory bank to which the subset of logical rows are mapped.

(B5) For the network device denoted as any of (B1) through (B4), wherein the computer-readable storage medium further comprises instructions for controlling the one or more computer processors to wherein the bank sets in the updated lookup instructions.

(B6) For the network device denoted as any of (B1) through (B5), wherein the computer-readable storage medium further comprises instructions for controlling the one or more computer processors to: use a network packet to obtain a first entry in a lookup table; use the first entry to obtain one of the lookup instructions among the updated lookup instructions; access memory rows in memory banks listed in the bank set of the obtained lookup instruction that are mapped to the logical row of the obtained lookup instruction; and process the network packet according to content in the accessed memory rows.

(C1) A method in a network device comprising: mapping a logical table to a plurality of memory banks $\{B_1 \ldots B_n\}$ that includes a memory bank $B_{old}$, wherein logical rows of the logical table are mapped to corresponding memory rows in each memory bank in $\{B_1 \ldots B_n\}$; storing lookup instructions for accessing the logical table, each lookup instruction being associated with a logical row and specifying the plurality of memory banks $\{B_1 \ldots B_n\}$; reallocating memory rows in memory banks $B_{old}$; in response to the reallocating, remapping logical rows corresponding to the reallocated memory rows in $B_{old}$ to memory rows in a new memory bank $B_{new}$; and updating lookup instructions that are associated with the remapped logical rows to specify the plurality of memory banks $\{B_1 \ldots B_n\}$ with memory bank $B_{old}$ being replaced with memory bank $B_{new}$.

(C2) For the method denoted as (C1), the method further comprises copying content from the reallocated memory rows in $B_{old}$ to the memory rows in $B_{new}$.

(C3) For the method denoted as any of (C1) through (C2), wherein the reallocated memory rows in $B_{old}$ are different rows of memory than the memory rows in $B_{new}$.

(C4) For the method denoted as any of (C1) through (C3), wherein prior to the reallocating all the lookup instructions specify the plurality of memory banks $\{B_1 \ldots B_n\}$, wherein subsequent to the reallocating all lookup instructions that are not associated with the remapped logical rows specify the plurality of memory banks $\{B_1 \ldots B_n\}$ with $B_{old}$ included and all lookup instructions that are associated with the remapped logical rows specify the plurality of memory banks $\{B_1 \ldots B_n\}$ with $B_{old}$ being replaced with $B_{new}$.

(C5) For the method denoted as any of (C1) through (C4), the method further comprises: using a network packet to obtain a first entry in a lookup table; using the first entry to obtain one of the access instructions among the updated access instructions; accessing memory rows in memory banks listed in the bank list of the obtained access instruction that are mapped to the logical row of the obtained access instruction; and processing the network packet according to content in the accessed memory rows.

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents may be employed without departing from the scope of the disclosure as defined by the claims.

The invention claimed is:

1. A method comprising:
    configuring a logical table by configuring a physical memory comprising a plurality of memory banks, wherein the logical table comprises logical rows that are backed by a first plurality of the memory banks, wherein each logical row maps to a corresponding memory row in each of the first plurality of memory banks;
    storing in a data store lookup instructions for accessing the logical table, each lookup instruction associated with a logical row and a bank set, wherein the bank set in each lookup instruction references memory banks in the first plurality of memory banks;
    reconfiguring the logical table by remapping a subset of logical rows of the logical table that are mapped to memory rows in a memory bank ("old memory bank") among the first plurality of memory banks to memory rows in a new memory bank that is not among the first plurality of memory banks; and
    updating one or more of the lookup instructions for accessing the reconfigured logical table, including:
        identifying lookup instructions that specify logical rows among the remapped subset of logical rows; and
        updating the bank set in each of the identified lookup instructions to refer to memory banks in a second plurality of memory banks, wherein the second plurality of memory banks includes the new memory bank and does not include the old memory bank, wherein the bank sets in lookup instructions associated with a logical row that is not among the remapped subset of logical rows refer to memory banks in the first plurality of memory banks, wherein bank sets in lookup instructions associated with a logical row that is among the remapped subset of logical rows refer to memory banks in the second plurality of memory banks.

2. The method of claim 1, further comprising copying content from the memory rows in the old memory bank to the memory rows in the new memory bank.

3. The method of claim 1, wherein the memory rows in the old memory bank are different rows of memory than the memory rows in the new memory bank.

4. The method of claim 1, wherein the second plurality of memory banks further includes a subset the first plurality of memory banks that excludes the old memory bank.

5. The method of claim 1, wherein reconfiguring the logical table occurs in response to memory rows in the old memory bank that map to the subset of logical rows being allocated to another logical table.

6. The method of claim 1, wherein subsequent to reconfiguring the logical table, logical rows in the subset of logical rows are no longer mapped to the old memory bank and are mapped to the new memory bank.

7. The method of claim 1, wherein prior to remapping the logical table, a given logical row within the subset of logical rows comprises a corresponding memory row in the old memory bank, wherein subsequent to remapping the logical table, the given logical row comprises a corresponding memory row in the new memory bank.

8. The method of claim 1, further comprising:
using a network packet to obtain a first entry in a lookup table;
using the first entry to obtain one of the lookup instructions among the updated lookup instructions;
accessing memory rows in memory banks listed in the bank set of the obtained lookup instruction that are mapped to the logical row of the obtained lookup instruction; and
processing the network packet according to content in the accessed memory rows.

9. A network device comprising:
a physical memory comprising a plurality of memory banks;
one or more computer processors; and
a computer-readable storage medium comprising instructions for controlling the one or more computer processors to:
configure a first mapping between a logical table and a plurality of memory banks, wherein logical rows of the logical table map to corresponding memory rows in each of the plurality of memory banks;
store lookup instructions in a data table in the physical memory, wherein each lookup instruction is associated with a logical row and a bank set that specifies memory banks in the plurality of memory banks;
configure a second mapping between the logical table and the plurality of memory banks and at least one new memory bank in response to memory rows in one of the memory banks in the plurality of memory banks becoming reallocated, wherein logical rows corresponding to the reallocated memory rows are remapped to memory rows in the new memory bank; and update lookup instructions in the data table whose logical rows are among the subset of logical rows by modifying bank sets in the lookup instructions to refer to the new memory bank in place of the memory bank with the reallocated memory rows.

10. The network device of claim 9, wherein lookup instructions whose logical rows are not among the subset of logical rows are not updated.

11. The network device of claim 9, wherein the computer-readable storage medium further comprises instructions for controlling the one or more computer processors to copy content from the reallocated memory rows to memory rows in the new memory bank.

12. The network device of claim 9, wherein the reallocated memory rows are different rows than the memory rows in the new memory bank to which the subset of logical rows are mapped.

13. The network device of claim 9, wherein the computer-readable storage medium further comprises instructions for controlling the one or more computer processors to wherein the bank sets in the updated lookup instructions.

14. The network device of claim 9, wherein the computer-readable storage medium further comprises instructions for controlling the one or more computer processors to:
use a network packet to obtain a first entry in a lookup table;
use the first entry to obtain one of the lookup instructions among the updated lookup instructions;
access memory rows in memory banks listed in the bank set of the obtained lookup instruction that are mapped to the logical row of the obtained lookup instruction; and
process the network packet according to content in the accessed memory rows.

15. A method in a network device comprising:
mapping a logical table to a plurality of memory banks $\{B_1 \ldots B_n\}$ that includes a memory bank $B_{old}$, wherein logical rows of the logical table are mapped to corresponding memory rows in each memory bank in $\{B_1 \ldots B_n\}$;
storing lookup instructions for accessing the logical table, each lookup instruction being associated with a logical row and specifying the plurality of memory banks $\{B_1 \ldots B_n\}$;
reallocating memory rows in memory banks $B_{old}$;
in response to the reallocating, remapping logical rows corresponding to the reallocated memory rows in $B_{old}$ to memory rows in a new memory bank $B_{new}$; and
updating lookup instructions that are associated with the remapped logical rows to specify the plurality of memory banks $\{B_1 \ldots B_n\}$ with memory bank $B_{old}$ being replaced with memory bank $B_{new}$.

16. The method of claim 15, further comprising copying content from the reallocated memory rows in $B_{old}$ to the memory rows in $B_{new}$.

17. The method of claim 15, wherein the reallocated memory rows in $B_{old}$ are different rows of memory than the memory rows in $B_{new}$.

18. The method of claim 15, wherein prior to the reallocating all the lookup instructions specify the plurality of memory banks $\{B_1 \ldots Bn\}$, wherein subsequent to the reallocating all lookup instructions that are not associated with the remapped logical rows specify the plurality of memory banks $\{B_1 \ldots B_n\}$ with $B_{old}$ included and all lookup instructions that are associated with the remapped logical rows specify the plurality of memory banks $\{B_1 \ldots B_n\}$ with $B_{old}$ being replaced with $B_{new}$.

19. The method of claim 15, further comprising:

using a network packet to obtain a first entry in a lookup table;

using the first entry to obtain one of the access instructions among the updated access instructions;

accessing memory rows in memory banks listed in the bank list of the obtained access instruction that are mapped to the logical row of the obtained access instruction; and processing the network packet according to content in the accessed memory rows.

\* \* \* \* \*